United States Patent
Ogimoto (10) Patent No.: US 9,939,466 B2
(45) Date of Patent: *Apr. 10, 2018

(54) NON-CONTACT CURRENT SENSOR

(71) Applicant: III HOLDINGS 3, LLC, Wilmington, DE (US)

(72) Inventor: Yasushi Ogimoto, Higashiyamato (JP)

(73) Assignee: III HOLDINGS 3, LLC, Wilmington, DE (US)

( * ) Notice: Subject to any disclaimer, the term of this patent is extended or adjusted under 35 U.S.C. 154(b) by 179 days.

This patent is subject to a terminal disclaimer.

(21) Appl. No.: 14/711,583

(22) Filed: May 13, 2015

(65) Prior Publication Data
US 2015/0247884 A1    Sep. 3, 2015

Related U.S. Application Data

(63) Continuation of application No. 13/387,318, filed as application No. PCT/JP2010/056508 on Apr. 12, 2010, now Pat. No. 9,041,388.

(30) Foreign Application Priority Data

Jul. 27, 2009 (JP) .................... 2009-174458

(51) Int. Cl.
*G01R 15/20* (2006.01)
*G01R 33/09* (2006.01)
*G01R 15/14* (2006.01)

(52) U.S. Cl.
CPC ......... *G01R 15/205* (2013.01); *G01R 15/148* (2013.01); *G01R 33/093* (2013.01); *G01R 33/098* (2013.01)

(58) Field of Classification Search
CPC .................... G01R 15/148; G01R 33/1284; G01R 33/093; B82Y 25/00; G11C 11/16;
(Continued)

(56) References Cited

U.S. PATENT DOCUMENTS 5,867,025 A    2/1999   Allenspach et al.
6,094,330 A    7/2000   Criniti et al.
(Continued)

FOREIGN PATENT DOCUMENTS

JP    11066519       3/1999
JP    2001159542 A   6/2001
(Continued)

OTHER PUBLICATIONS

Extended European Search Report for Application No. EP 10 80 4161.7, dated Dec. 21, 2017, 10 pages.

*Primary Examiner* — Huy Q Phan
*Assistant Examiner* — David Frederiksen
(74) *Attorney, Agent, or Firm* — McAndrews, Held & Malloy, Ltd.

(57) ABSTRACT

A non-contact current sensor includes a spin valve structure (2), an electrical unit (4) that applies a varying current to the spin valve structure (2), and a resistance reading unit that electrically reads out a resistance value of the spin valve structure (2). When a current-induced magnetic field is detected, a coercive force of a free layer (14) is configured to be larger than the current-induced magnetic field as a detection target, and the electrical unit (4) allows the magnetization directions of a pinned layer (12) and the free layer (14) to transition between a mutually parallel state and a mutually anti-parallel state by applying the current to the spin valve structure (2). The resistance reading unit (5) detects a threshold value corresponding to the transition.

20 Claims, 6 Drawing Sheets

(58) Field of Classification Search
CPC .................. H01L 43/08; H01L 27/224; H01F 10/32–10/3295
See application file for complete search history.

(56) References Cited

U.S. PATENT DOCUMENTS

| | | | |
|---|---|---|---|
| 6,134,091 A * | 10/2000 | Toki | B82Y 10/00 360/324.11 |
| 6,191,577 B1 | 2/2001 | Sasaki et al. | |
| 6,323,634 B1 | 11/2001 | Nakagawa et al. | |
| 6,894,878 B1 | 5/2005 | Cross | |
| 6,984,989 B2 | 1/2006 | Kudo et al. | |
| 2003/0039081 A1 * | 2/2003 | Seigler | B82Y 10/00 360/324.11 |
| 2003/0235072 A1 * | 12/2003 | Kim | G11C 11/1675 365/158 |
| 2004/0136231 A1 | 7/2004 | Huai et al. | |
| 2005/0063106 A1 * | 3/2005 | Hibino | B82Y 10/00 360/324.12 |
| 2005/0068684 A1 | 3/2005 | Gill | |
| 2005/0104101 A1 * | 5/2005 | Sun | B82Y 25/00 257/295 |
| 2005/0141146 A1 * | 6/2005 | Pinarbasi | B82Y 10/00 360/324.1 |
| 2005/0244873 A1 | 11/2005 | Ikeda et al. | |
| 2006/0203398 A1 * | 9/2006 | Ishizone | B82Y 25/00 360/324.12 |
| 2006/0209473 A1 | 9/2006 | Oshima et al. | |
| 2006/0227466 A1 | 10/2006 | Yagami | |
| 2007/0063690 A1 | 3/2007 | De Wilde et al. | |
| 2007/0070556 A1 * | 3/2007 | Zhang | B82Y 10/00 360/324.11 |
| 2007/0111332 A1 * | 5/2007 | Zhao | B82Y 10/00 438/3 |
| 2007/0165334 A1 * | 7/2007 | Takenaga | B82Y 25/00 360/313 |
| 2007/0268632 A1 | 11/2007 | Jogo et al. | |
| 2008/0032158 A1 | 2/2008 | Sasaki | |
| 2008/0042834 A1 * | 2/2008 | Daughton | B82Y 25/00 340/551 |
| 2008/0238420 A1 | 10/2008 | Haratani et al. | |
| 2008/0284419 A1 | 11/2008 | Ikeda | |
| 2008/0316655 A1 | 12/2008 | Shoji | |
| 2009/0122450 A1 * | 5/2009 | Wang | B82Y 10/00 360/324.2 |
| 2009/0322419 A1 * | 12/2009 | Maehara | G11C 11/16 330/60 |
| 2010/0065935 A1 * | 3/2010 | Horng | B82Y 25/00 257/421 |
| 2010/0201356 A1 * | 8/2010 | Koller | B29C 45/0013 324/252 |
| 2011/0163739 A1 * | 7/2011 | Ono | B82Y 25/00 324/207.21 |
| 2011/0221433 A1 * | 9/2011 | Ohta | B82Y 25/00 324/252 |

FOREIGN PATENT DOCUMENTS

| | | |
|---|---|---|
| JP | 2001516459 | 9/2001 |
| JP | 2006208295 | 8/2006 |
| JP | 2006269885 | 10/2006 |
| JP | 2007101253 A | 4/2007 |
| JP | 2007305629 | 11/2007 |
| JP | 2008065410 | 8/2008 |
| JP | 2008249556 A | 10/2008 |
| JP | 20090002911 A | 1/2009 |
| KR | 19977007449 A | 12/1997 |
| KR | 1019980011526 | 4/1998 |
| KR | 19980079939 A | 11/1998 |
| KR | 1020070056903 | 6/2007 |
| WO | 2009001951 | 12/2008 |
| WO | 2009078202 | 6/2009 |

* cited by examiner

NON-CONTACT CURRENT SENSOR

CROSS-REFERENCE TO RELATED APPLICATIONS/INCORPORATION BY REFERENCE

The present application is a continuation and claims priority under 35 U.S.C. § 120 to co-pending U.S. patent application Ser. No. 13/387,318, filed Jan. 26, 2012, which claims priority under 35 U.S.C. § 371 to International Application No. PCT/JP2010/56508, filed Apr. 12, 2010, which claims priority to Japanese Patent Application Ser. No. 2009-174458, filed on Jul. 27, 2009. The entire contents of the above-mentioned prior-filed applications are hereby expressly incorporated herein by reference.

TECHNICAL FIELD

The present invention relates to a non-contact current sensor, and more particularly, to a sensor that measures a current in a non-contact manner by detecting a magnetic field induced by the current.

BACKGROUND ART

Recently, there has been a remarkable increase in the interest in environmental and energy technologies, and a technology for measuring a current value of electrical equipment with high precision in a non-contact manner is necessary in many situations. For example, a current sensor is essential for an inverter that is a representative device of power semiconductors and is essential for a breaker as well.

Since the above-described devices consume a current of hundreds of amperes, in a case where a magnetic field (current-induced magnetic field) that is induced by the current is to be detected in a non-contact manner, the magnitude of the magnetic field to be measured by the current sensor used for the detection is a one-digit number to tens of oersteds (Oe).

In addition, in a case where a current sensor is used in car electronics, since an environmental noise inside an engine room is high, it is difficult to use an MI sensor that is saturated although it has an extremely high sensitivity. Accordingly, in such a case, a non-contact current sensor using a giant magnetoresistance (GMR) element or a tunneling magnetoresistance (TMR) element is considered to be used.

The above-described GMR element and the TMR element have already been practically used as read heads of a hard disk. The GMR element and the TMR element have a magnetic multi-layered film structure called a spin valve. Here, the spin valve structure is a structure that is made by stacking a magnetic layer (pinned layer), a non-magnetic layer, and a magnetic layer (free layer). The pinned layer is configured such that the magnetization direction is difficult to be reversed more than that of the free layer. The non-magnetic layer is arranged so as to achieve the function of cutting out the magnetic coupling between two magnetic layers (between the pinned layer and the free layer). The spin valve structure operates as a GMR element in a case where a metal is used for the non-magnetic layer and operates as a TMR element in a case where an insulator is used.

As the operating principle of the GMR element and the TMR element, a phenomenon is used in which the magnetization direction of the free layer has an angle with respect to the magnetization direction of the pinned layer due to an effect of a magnetic field which is a detection target. In other words, since the resistance value of the spin valve structure changes in accordance with the angle, the GMR element and the TMR element detect a magnetic field in accordance with the change in the resistance value. Here, the resistance value is the lowest in a case where the magnetization direction of the free layer and the magnetization direction of the pinned layer are parallel to each other (parallel arrangement), and the resistance value is the highest in a case where the magnetization direction of the free layer and the magnetization direction of the pinned layer are anti-parallel to each other (anti-parallel arrangement).

In order to detect a minute leakage of the magnetic field from the detection target, the GMR element and the TMR element are based on an analog operation for detecting a magnetic field in an area, which has linearity, between the parallel arrangement and the antiparallel arrangement.

For example, a ferromagnetic film (called a hard bias film) is arranged to be adjacent to in a magnetic head. In other words, a predetermined bias magnetic field is applied due to this arrangement, and a state is formed in advance in which the magnetization direction of the free layer is inclined with respect to the magnetization direction of the pinned layer. By using the initially inclined state as a reference, the above-described analog operation is realized. In addition, since the sensitivity of a device is determined based on the coercive force of the free layer, in the GMR element and the TMR element, the materials or the structure is designed such that the coercive force of the free layer is lower than the magnetic field as the detection target.

CITATION LIST

Patent Literature

Patent Literature 1: Japanese Patent Application Laid-Open No. 2007-305629

DISCLOSURE OF INVENTION

Problem to be Solved by the Invention

However, the GMR element and the TMR element that perform the analog operation as described above are not appropriate for applying to a power semiconductor or a breaker, or to the measurement under a condition such as car electronics in which the environmental noise is high. In other words, in a case where a high-precision (high resolution) measurement is performed in an analog operation, it is difficult to avoid a problem that is based on the principle that the output is decreased in exchange for the resolution. Accordingly, it is difficult for the GMR element and the TMR element to operate under an environment in which a peripheral environmental noise is strong, and there arises a new problem in that a preamplifier with a high-performance and high speed is needed at a later stage and the like. On the other hand, although a problem, which occurs in an analog operation, rarely occurs in a digital detecting operation, only a binary value corresponding to the parallel arrangement or the anti-parallel arrangement is detected, and accordingly, there is another problem in that the applicable range as a non-contact current sensor is narrowed.

The present invention is contrived with such situations being taken into account, and the object thereof is to provide a non-contact current sensor that can operate even in an environment having a high environmental noise. More particularly, the object of the present invention is to provide a non-contact current sensor that can detect a current-induced magnetic field of a one-digit number to tens of Oe with magnetic resolution, which is infinitely small in principle, with high precision without being limited by the coercive force of the free layer.

Means for Solving the Problem

The inventor of the present application reviewed the above-described problems with the current state of a conventional non-contact sensor, which is based on an analog operation premised on the linearity, being taken in account, and has reached the invention of a non-contact current sensor that is based on a digital operation using a quantization technique represented below.

In other words, in order to solve the above-described problems, the non-contact current sensor according to the present invention includes: a spin valve structure that includes a free layer, a pinned layer, and a nonmagnetic layer arranged between the free layer and the pinned layer; an electrical unit that applies a current to the spin valve structure when a current-induced magnetic field is detected; and a resistance reading unit that electrically reads out a resistance value of the spin valve structure when the current-induced magnetic field is detected.

In addition, a coercive force of the free layer is configured to be larger than the current-induced magnetic field as a detection target. Furthermore, the electrical unit allows magnetization directions of the pinned layer and the free layer to transit between a mutually parallel state and a mutually anti-parallel state by applying the current to the spin valve structure, and the resistance reading unit is configured to detect a threshold value of the current or the current-induced magnetic field corresponding to transition by reading out the resistance value corresponding to the transition between the parallel state and the anti-parallel state.

According to the above-described configuration, by associating the parallel state and the anti-parallel state of the magnetization direction of the free layer having the spin valve structure with respect to the direction of the pinned layer with logical values "0" and "1", the sensing operation of the non-contact current sensor can be performed as a digital operation. In addition, the detection of a magnetic field with high precision can be performed in the non-contact current sensor through quantization corresponding to the current value at the time of transition between the parallel state and the anti-parallel state.

In other words, the above-described configuration focuses on a point that the threshold value of the current required for the transition of the magnetization direction of the free layer decreases in a case where the current-induced magnetic field is present. In the present invention, it is used that the threshold value of the current required for the transition of the magnetization direction of the free layer changes in accordance with the magnitude of the current-induced magnetic field. In other words, when a current-induced magnetic field is detected, the threshold value of the magnetic field that can be detected is changed by changing the value of the electric bias (current or voltage) by using the electrical unit. According to the present invention, by performing the quantization by using this, an ideal non-contact current sensor that detects a magnetic field with high precision (infinitely small in principle) without sacrificing the sensor output, which is difficult to perform in an analog operation and a binary digital operation.

In addition, according to another embodiment of the present invention, a plurality of the spin valve structures having different areas are disposed, and the plurality of the spin valve structures are connected in series. Accordingly, in a case where the electrical unit allows the same current to flow through the plurality of the spin valve structures, the current densities in the spin valve structures change. In other words, different magnetic threshold values (that can be detected without using a current) can be assigned to the spin valve structures.

In addition, according to another embodiment of the present invention, the electrical unit is configured to change a pulse height every time the current is applied. In other words, the application of a current, which is performed by the electrical unit, and the read-out of a resistance value, which is performed by the resistance reading unit are alternately performed a plurality of numbers of times, and the electrical unit changes the pulse height every time the current is applied. Accordingly, the quantization corresponding to the pulse height is performed.

In addition, according to another embodiment of the present invention, the electrical unit is configured to change a pulse width every time the current is applied. In other words, the application of a current, which is performed by the electrical unit, and the read-out of a resistance value, which is performed by the resistance reading unit are alternately performed a plurality of numbers of times, and the electrical unit changes the pulse width every time the current is applied. Accordingly, the quantization corresponding to the pulse width is performed.

Effect of the Invention

According to a non-contact current sensor of the present invention, since a spin valve structure that includes a free layer, a pinned layer, and a nonmagnetic layer arranged between the free layer and the pinned layer, an electrical unit that applies a current to the spin valve structure when a current-induced magnetic field is detected, and a resistance reading unit that electrically reads out a resistance value of the spin valve structure when the current-induced magnetic field is detected are included, a coercive force of the free layer is configured to be larger than the current-induced magnetic field as a detection target, the electrical unit allows magnetization directions of the pinned layer and the free layer to transit between a mutually parallel state and a mutually anti-parallel state by applying the current to the spin valve structure, and the resistance reading unit is configured to detect a threshold value of the current or the current-induced magnetic field corresponding to transition by reading out the resistance value corresponding to the transition between the parallel state and the anti-parallel state, by associating the parallel state and the anti-parallel state of the magnetization direction of the free layer having the spin valve structure with respect to the direction of the pinned layer with logical values "0" and "1", the detection of a magnetic field by using the non-contact current sensor can be performed as a digital operation. In other words, compared to a conventional case in which an analog magnetic field is detected based on an angle between the magnetization directions of the free layer and the pinned layer, it is difficult for the non-contact current sensor to receive the effect of an environmental noise, whereby a magnetic field can be detected with high precision. In other words, the detection of a current with high precision can be performed by the non-contact current sensor.

In addition, according to the non-contact current sensor of the present invention, a plurality of the spin valve structures having different areas are disposed, and the plurality of the spin valve structures are connected in series, and accordingly, when the electrical unit allows the same current to flow, the current densities in the spin valve structures are different from one another. At that time, in the spin valve structure on which the current density that is a threshold value corresponding to the magnetic field as a detection target or more is acted, the magnetization directions of the pinned layer and the free layer transit between the parallel state and the anti-parallel state, and that state is maintained. As above, the quantization corresponding to the number of the spin valve structures is performed, whereby a magnetic field can be detected with high precision by applying the current once. In addition, since the magnetic field can be detected by only applying the current once, the detection of a magnetic field at high speed can be performed.

In addition, according to the non-contact current sensor of the present invention, since the electrical unit is configured to change a pulse height every time the current is applied, the value of a magnetic field is detected in accordance with the pulse height, whereby the magnetic field can be detected by employing one spin valve structure.

In addition, according to the non-contact current sensor of the present invention, since the electrical unit is configured to change a pulse width every time the current is applied, the value of a magnetic field is detected in accordance with the pulse width, whereby the magnetic field can be detected by employing one spin valve structure.

BEST MODE(S) FOR CARRYING OUT THE INVENTION

Figure 1:
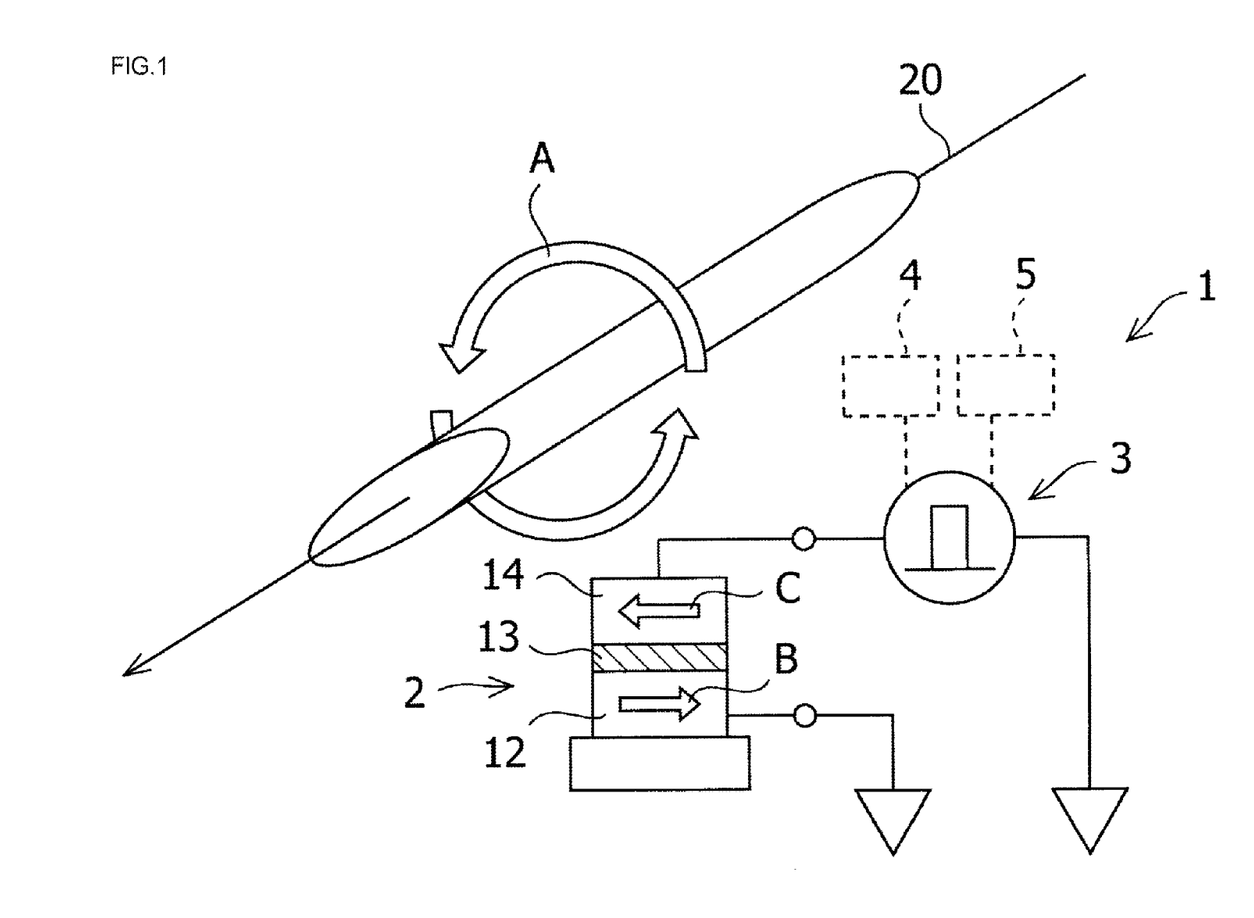
FIG. 1 is a diagram that schematically illustrates the relation between a non-contact current sensor according to an embodiment of the present invention and a current and a magnetic field (current-induced magnetic field) as a detection target.
Figure 2:
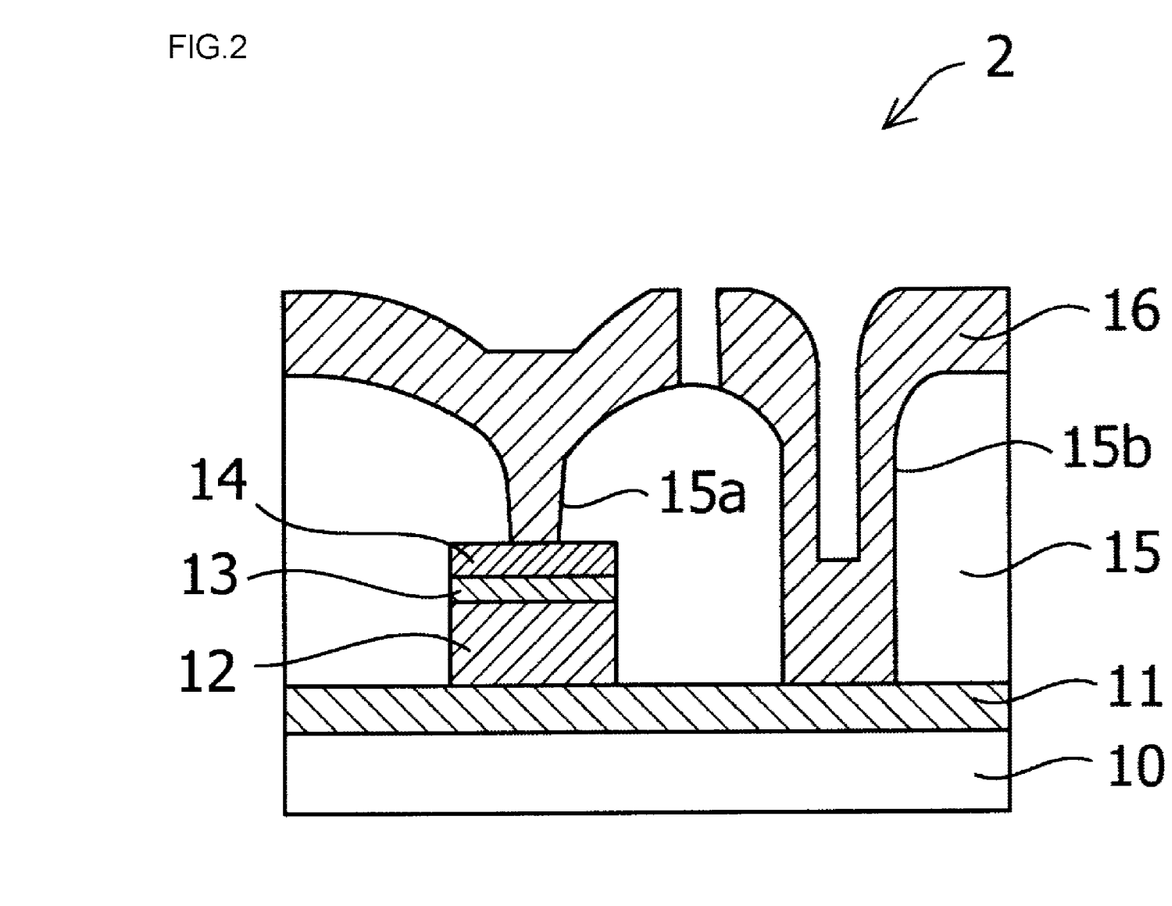
FIG. 2 is a cross-sectional view of a spin valve structure of a non-contact current sensor according to an embodiment of the present invention.

Hereinafter, a non-contact current sensor according to an embodiment of the present invention will be described with reference to the drawings. FIG. 1 is a diagram that schematically illustrates the relation between a non-contact current sensor according to an embodiment of the present invention and a current and a magnetic field (current-induced magnetic field) as a detection target. FIG. 2 is a cross-sectional view of a TMR element of a non-contact current sensor according to an embodiment.

The non-contact current sensor 1 according to this embodiment detects a current-induced magnetic field A that is induced by a current 20 as a measurement target by using a GMR element or a TMR element.

As illustrated in FIG. 1, the non-contact current sensor 1 includes a TMR element 2 formed to have a spin valve structure and an electric pulse source 3 that is connected to the TMR element 2.

The TMR element 2 includes a plurality of layers stacked by using a sputtering method. As illustrated in FIG. 2, on a substrate 10, a lower electrode (Cu/Ta) 11, a pinned layer (CoFeB/Ru/CoFe/IrMn) 12, a tunnel insulating film (MgO) 13 as a non-magnetic layer, and a free layer (CoFeB) 14 are stacked in the mentioned order.

As illustrated in FIG. 2, three layers of the pinned layer 12, the tunnel insulating film 13, and the free layer 14 are processed to have a bonding size of 200×100 nm by using a technique such as Ar ion milling or the like. In addition, on the three layers 12, 13, and 14 and the lower electrode 11, in an interlayer insulating film ($SiO_2$) 15 is formed.

As illustrated in FIG. 2, in the interlayer insulating film 15, a first contact hole 15a that is used for a connection with the three layers (bonding portion) of the pinned layer 12, the tunnel insulating film 13, and the free layer 14 and a second contact hole 15b that is used for a connection with the lower electrode 11 are formed. In addition, on the interlayer insulating film 15, an upper electrode (Cu/Ta) 16 is formed.

By employing the configuration as described above, in the TMR element 2, a magnetization direction of the pinned layer 12 can be fixed by performing annealing inside a magnetic field of about 1 T at the temperature of 300° C. to 350° C. In addition, at this time, by crystallizing the tunnel insulating film (MgO) 13 and CoFebB of the pinned layer 12 and the free layer 14, huge magnetoresistance of 100% to 200% (that is, an output value based on a resistance change corresponding to a parallel state (low resistance) or an anti-parallel state (high resistance) in the arrangement of the magnetization of the free layer 14 and the pinned layer 12 at the time of sensing a magnetic field) can be acquired.

As illustrated in FIG. 1, the electric pulse source 3 includes: an electrical unit 4 that applies a current to the spin valve structure of the TMR element 2 at the time of detecting the current-induced magnetic field A; and a resistance reading unit 5 that electrically reads out the resistance value of the spin valve structure of the TMR element 2 at the time of detecting the current-induced magnetic field A.

The electrical unit 4 according to this embodiment is used as means for performing magnetization reversal of the free layer 14 called current-injected magnetization reversal that has been recently discovered and is currently researched as a key technique of a non-volatile memory (MRAM).

This current-injected magnetization reversal is a method for reversing (transmitting) the magnetization direction B of the pinned layer 12 and the magnetization direction C of the free layer 14 from the parallel state to the anti-parallel state or from the antiparallel state to the parallel state by using the polarity of the current.

First, a case will be described in which the magnetization direction B of the pinned layer 12 and the magnetization direction C of the free layer 14 are parallel to each other.

Here, the magnetization directions of the pinned layer 12 and the free layer 14 being parallel to each other represents that the magnetization directions of both the layers are arranged in the same direction.

In order to set the magnetization directions of the pinned layer 12 and the free layer 14 to be parallel to each other, the electrical unit 4 allows a current flow from the free layer 14 side. Then, electrons that are spin-polarized are injected from the pinned layer 12 into the free layer 14 through the tunnel insulating film 13. When the electrons that are spin-polarized are injected into the free layer 14, torque is applied to the magnetization of the free layer 14 in the same direction as the magnetization direction of the pinned layer 12. Accordingly, the magnetization direction C of the free layer 14 transits to a state of being parallel to the magnetization direction B of the pinned layer 12. In addition, this state is set to a logical value "0".

Next, a case will be described in which the magnetization direction B of the pinned layer 12 and the magnetization direction C of the free layer 14 are anti-parallel to each other. Here, the magnetization directions of the pinned layer 12 and the free layer being anti-parallel to each other represents that the magnetization directions of both the layers face toward directions opposite to each other.

In the state in which the magnetization directions of the pinned layer 12 and the free layer 14 are parallel to each other, the electrical unit 4 allows a current flow from the pinned layer 12 side. Then, electrons that are spin-polarized are injected from the free layer 14 into the pinned layer 12 through the tunnel insulating film 13. At this time, only the electrons having spin parallel to the pinned layer 12 are injected into the pinned layer 12, but the electrons having spin non-parallel to the pinned layer 12 are reflected and are accumulated in the free layer 14. Accordingly, the magnetization direction C of the free layer 14 transits to a state of being anti-parallel to the magnetization direction B of the pinned layer 12. In addition, this state is set to a logical value "1".

The resistance reading unit 5 is configured to read out the resistance value of the TMR element 2 that is generated based on the TMR effect. The electric resistance of the TMR element 2 changes between the parallel state (logical value "0") and the anti-parallel state (logical value "1") as described above. This phenomenon is called a tunnel magnetoresistive effect (TMR effect). In other words, the non-contact current sensor 1 according to this embodiment is configured to detect the current value of the electrical unit 4 corresponding to the transition by reading out the resistance value when the resistance reading unit 5 transits from the logical value "0" to the logical value "1". Accordingly, the non-contact current sensor 1 can detect the current-induced magnetic field A of the current 20. In addition, the current value (voltage value) used for the read-out at this time may be set to a value that does not cause the magnetization reversal of the above-described free layer 14, that is, a threshold value of the current-injected magnetization reversal or less.

In this embodiment, the structure or the materials are designed such that the coercive force of the magnetization of the free layer 14 is larger than the current-induced magnetic field A as a detection target, which is different from a conventional magnetic sensor, a conventional non-contact current sensor, or an MRAM that performs recording removing by using the current-induced magnetic field.

As a method that can be used for such a purpose, a method is known in which the coercive force is changed by changing the structure. For example, when shape magnetic anisotropy is used, a demagnetization field increases by shortening the size in the magnetization direction, whereby the coercive force can be increased.

In addition, a phenomenon can be used in which the coercive force increases in proportion to 1/D by changing the size (D). For example, as the size up to 100 nm illustrated in this embodiment, by decreasing the element size from 100 nm to 50 nm, the coercive force can be doubled. Furthermore, in a case where the element size is constant, the coercive force can be changed based on the film thickness although the dependency thereof differs in accordance with the material. On the other hand, it is apparent that a magnetic material having a different coercive force can be used. In addition, by adding a nonmagnetic material such as Pt, Ta, or Nb to a soft magnetic material such as CoFe, CoFeB, or NiFe, the coercive force can be increased in the range of several Oe to 100 Oe. Furthermore, it is apparent that a perpendicular magnetic film such as TbFeCo or a Co/Ni multi-layer film that is a ferrimagnetic material can be used.

Next, a method of detecting a current-induced magnetic field in the non-contact current sensor 1 according to the present invention will be described below.

For example, it is assumed that the coercive force of the free layer 14 is 15 Oe, and the magnetic field as a detection target is 10 Oe or less. As above, in a case where the strength of the magnetic field is lower than the coercive force of the free layer 14, when a current is not applied to the spin valve structure of the TMR element 2, the magnetization of the free layer 14 does not transmit between the parallel state (logical value "0") and the non-parallel state (logical value "1"). Accordingly, it is difficult to detect the current-induced magnetic field according to the current. Naturally, the voltage-current value used when the resistance value is read out by the resistance reading unit 5 is sufficiently less than a value required for the transition of the magnetization direction of the free layer 14, whereby no change occurs.

Here, the present invention focuses on a point that the threshold value of the current required for the transition of the magnetization direction of the free layer 14 decreases in a case where the current-induced magnetic field is present. In other words, it is used that the threshold value of the current required for the transition of the magnetization direction of the free layer 14 changes in accordance with the magnitude of the current-induced magnetic field. In other words, since the state transition between the parallel arrangement and the anti-parallel arrangement of the magnetization can be performed independently from two types of external fields, in other words, a (current-induced) magnetic field or the current, at this time, when one external field is set as a parameter, the threshold value of switching (the state transition) of the other external field is changeable. Accordingly, quantization can be performed at an infinitely small sample interval in principle. Therefore, detection of a magnetic field can be performed with high precision, which has an infinitely-small resolution capability in principle without being limited by the coercive force of the free layer 14, without decreasing the output (the reason is that the output is constantly "0" or "1" as a digital value).

Figure 3:
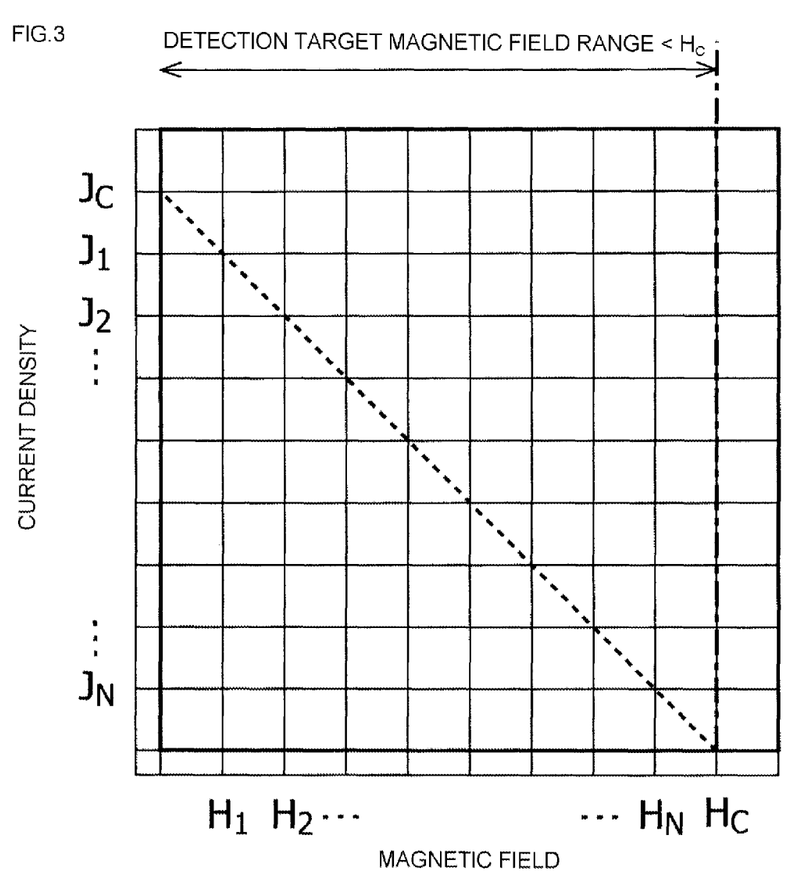
FIG. 3 is a diagram illustrating the relation between a magnetic field as a detection target and the current density of a current applied at the time of detection in a non-contact current sensor according to an embodiment of the present invention.

FIG. 3 is a diagram illustrating the relation between a magnetic field as a detection target and the current density of a current applied at the time of detection in a non-contact current sensor 1 according to an embodiment of the present invention. Here, the current density represents a current value per unit area.

Here, the current applied to the TMR element 2 at the time of detecting the magnetic field is denoted by I (In other words the current value is constant) FIG. 3 illustrates the relation between N current densities $J_1$ to $J_N$ and the magnitudes $H_1$ to $H_N$ of N magnetic fields at the current I.

As denoted by a dotted line illustrated in FIG. 3, the current density and the range (lower limit) of the magnetic field are in one-to-one correspondence with each other. The linear relation illustrated in FIG. 3 is a result of acquiring a threshold value of the current density through simulation in a situation in which a current-induced magnetic field is present.

On the other hand, even in a case where a graph is redrawn by squaring the current density represented in the vertical axis of FIG. 3 and setting the horizontal axis as a magnetic field, the same linear relation can be acquired. It is understood that this linear relation corresponds to a condition (in the range of the first-order approximation) that the sum of magnetic energy and electric energy (spin current), which is required for the transition of the magnetization direction of the free layer 14, is constant.

$$\text{Const} = I^2 R + MH \qquad \text{Equation (1)}$$

Here, I is a current applied to the TMR element 2, and R is a resistance value measured by the TMR element 2. In addition, M denotes the magnetization of the free layer 14, and H denotes the magnetic field as a detection target.

In addition, the linear relation acquired here is not necessarily required, and the current density and the value of the magnetic field may be in one-to-one correspondence with each other. However, in a case where the linear relation can be acquired, there is an advantage of being able to respond to the range of the magnetic field as a detection target by using a predetermined margin of the current width in performing bias control at the time of detecting the magnetic field.

As illustrated in FIG. 3, since the magnitudes of the magnetic fields that can be detected in accordance with N current densities $J_1$ to $J_N$ are $H_1$ to $H_N$, N quantization processes are performed in this embodiment. In other words, the current density $J_i$ ($J_1 \leq J_i \leq J_N$) corresponding to a magnetic field $H_i$ ($H_1 \leq H_i \leq H_N$) out of N sampled magnetic fields having coercive forces of 10 Oe or less as detection targets can be detected as a digital value in correspondence with the transition of the magnetization direction of the free layer 14.

Here, by increasing the number of quantization samples in accordance with the measurement precision, the current-induced magnetic field can be detected with higher precision. In addition, by using a pulse also in reading the resistance value that is performed by the resistance reading unit 5, the S/N can be improved by performing lock-in detection in accordance with the period of the pulse. In such a case, the magnetic field can be detected at higher precision.

In addition, Jc represented on the uppermost side of the vertical axis illustrated in FIG. 3 is a threshold value of the current density in a case where the current-induced magnetic field is zero. By using this current density Jc, the magnetization directions of the pinned layer 12 and the free layer 14 can be initialized to any one state of the parallel state and the anti-parallel state.

Figure 4A:
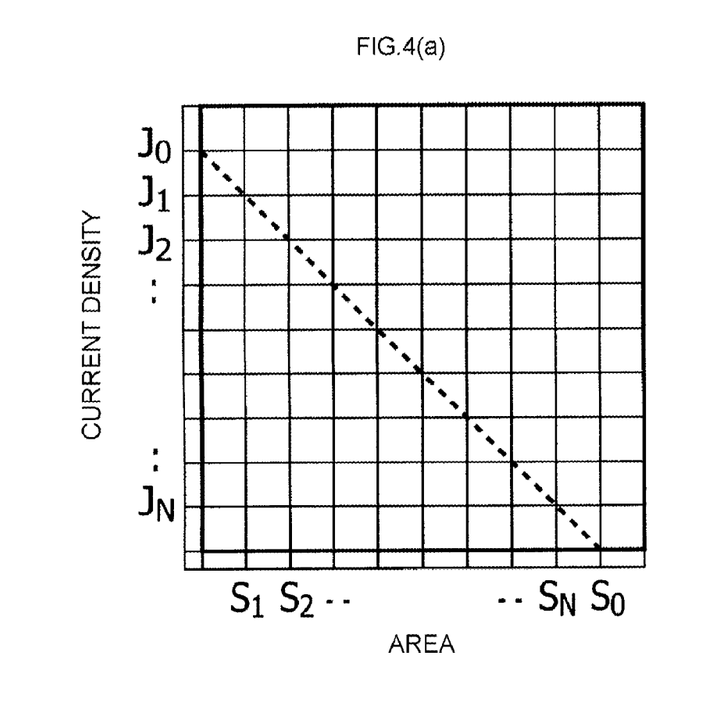
FIG. 4(a) is a diagram that illustrates the relation between the area of a bonding portion of the spin valve structure and the current density of a current applied at the time of detection.

Next, a first embodiment for performing quantization samplings in the non-contact current sensor 1 according to the present invention will be described. FIG. 4(a) is a diagram that illustrates the relation between the area of a bonding portion of the spin valve structure and the current density of a current applied at the time of detection, and FIG. 4(b) is a diagram that schematically illustrates a configuration in which spin valve structures having mutually different areas are connected in series.

Figure 4B:
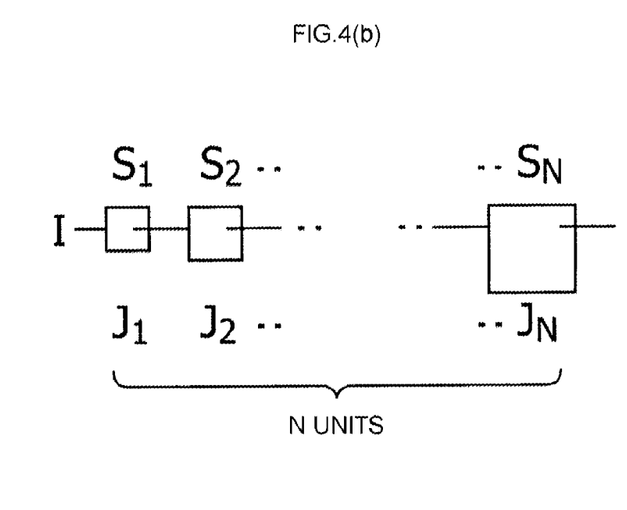
FIG. 4(b) is a diagram that schematically illustrates a configuration in which spin valve structures having mutually different areas are connected in series.

As illustrated in FIG. 4(b), in this embodiment, a plurality of the spin valve structures (TMR elements) having mutually different areas are disposed, and the plurality of the spin valve structures are connected in series. Then, the electrical unit 4 is configured to apply a constant current I to a high-layer of the spin valves connected in series.

When the constant current I is applied to the spin valve structures connected in series, the spin valve structures have mutually different areas, and accordingly, the current density differs for each spin valve structure. In other words, as illustrated in FIG. 4(a), N current densities $J_1$ to $J_N$ correspond to N spin valve structures $S_1$ to $S_N$ having mutually different areas for forming one-to-one correspondence. Therefore, according to this embodiment, by only using the single current I, quantization samplings corresponding to the number of the spin valve structures can be performed.

In addition, since the areas of the spin valve structures are different from each other, the resistance value corresponding to the transition of the magnetization direction of the free layer 14 also differs for each spin valve structure. By using this, also in the reading of a resistance value that is performed by the resistance reading unit 5, the value of the magnetic field corresponding to the detection can be determined at once by detecting a voltage value of each spin valve structure at the time of applying a read-out current to the spin valve structures connected in series.

Figure 5:
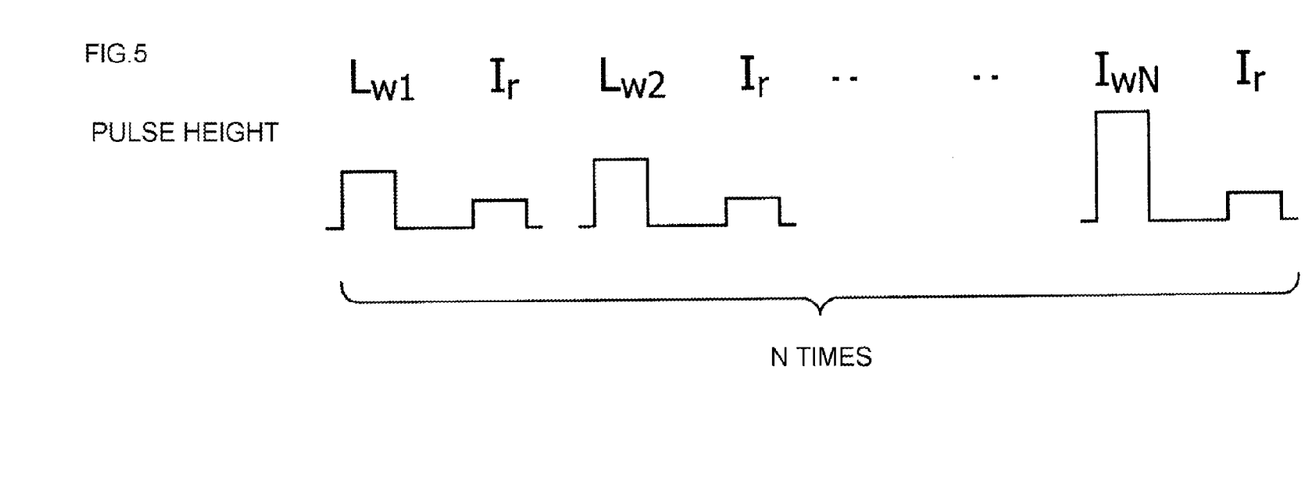
FIG. 5 is diagram illustrating a process in which the application of a current pulse and the read-out of a resistance value are alternately performed N times in a non-contact current sensor according to an embodiment of the present invention and is a diagram illustrating a process in which the pulse height of the current is changed every time the current pulse is applied.

Next, a second embodiment for performing quantization samplings in a non-contact current sensor 1 according to the present invention will be described. FIG. 5 is diagram illustrating a process in which the application of a current pulse and the read-out of a resistance value are alternately performed N times in the non-contact current sensor 1 according to an embodiment of the present invention.

As illustrated in FIG. 5, the application of a current, which is performed by the electrical unit 4, and the read-out of a resistance value, which is performed by the resistance reading unit 5, are alternately performed N times. Here, $L_{w1}$, $L_{w2}$, ..., $L_{wN}$ represent the pulse heights of currents applied by the electrical unit 4, and Ir represents a read-out current read by the resistance reading unit 5.

As illustrated in FIG. 5, the electrical unit 4 is configured to change the pulse height every time a current is applied. In other words, the electrical unit 4 changes the pulse height to $L_{w1}$, $L_{w2}$, ..., $L_{wN}$ every time a current is applied.

In this embodiment, the quantization samplings are performed by associating the change (the number N of quantization samplings) in the current density illustrated in FIG. 3 with the pulse heights of N currents.

Therefore, according to this embodiment, N quantization samplings can be performed by employing only one spin valve structure. In addition, it is more preferable to configure the electrical unit 4 to change the pulse height starting from a low value to a higher value when the current is applied. The reason for this is that the process of initializing the magnetization direction of the free layer 14 may not be required by employing this configuration.

Figure 6A:
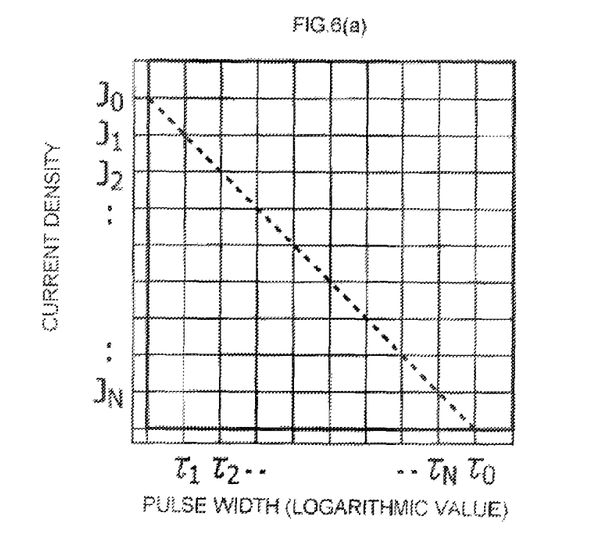
FIG. 6(a) is a diagram that illustrates the relation between a current pulse width (logarithmic value) and the current density of a current applied at the time of detection.

Next, a third embodiment for performing quantization samplings in a non-contact current sensor 1 according to the present invention will be described. FIG. 6(a) is a diagram that illustrates the relation between a current pulse width (logarithmic value) and the current density of a current applied at the time of detection, and FIG. 6(b) is a diagram that illustrates a process in which the application of a current pulse and the read-out of a resistance value are alternately performed N times.

Figure 6B:
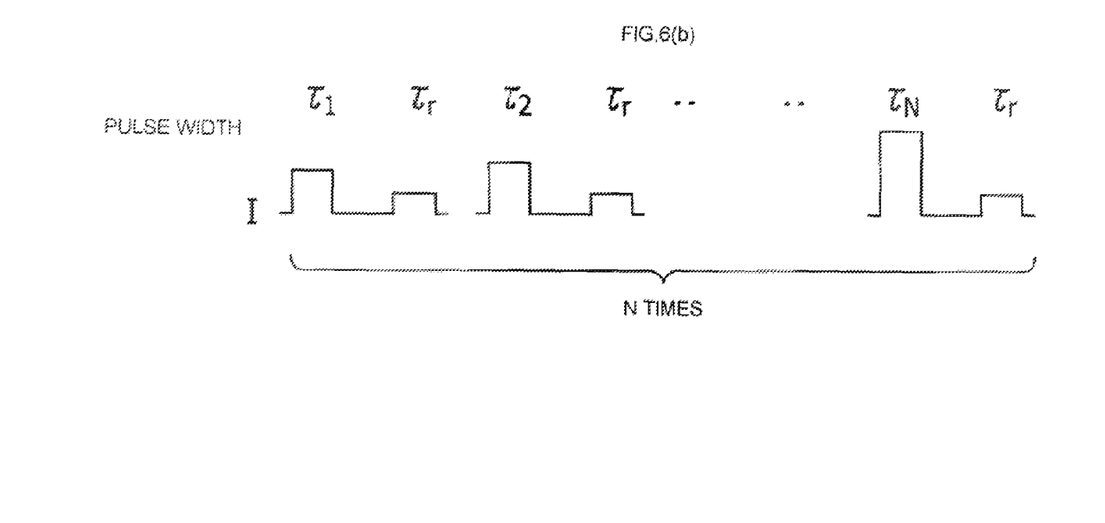
FIG. 6(b) is a diagram that illustrates a process in which the application of a current pulse and the read-out of a resistance value are alternately performed N times and is a diagram that illustrates a process in which the pulse width of the current is changed every time the current pulse is applied.

As illustrated in FIG. 6(b), the application of a current, which is performed by the electrical unit 4, and the read-out of a resistance value, which is performed by the resistance reading unit 5, are alternately performed N times. Here, $\tau_1$, $\tau_2, \ldots, \tau_N$ represent the pulse widths of currents applied by the electrical unit 4, and $\tau_r$ represents the pulse width of a read-out current read by the resistance reading unit 5.

As illustrated in FIG. 6(*b*), the electrical unit 4 is configured to change the pulse width every time a current is applied. In other words, the electrical unit 4 changes the pulse width to $\tau_1, \tau_2, \ldots, \tau_N$ every time a current is applied.

It is known that the current density required for the transition of the magnetization direction of the free layer 14 and the pulse width of the current have the following relation.

$$J_c = J_c 0\{1-(k_B T/E)\ln(\tau_p/\tau 0)\} \quad \text{Equation (2)}$$

Here, $J_c$ is a threshold value of the current density required for the transition of the magnetization direction of the free layer 14, and $\tau_p$ is a pulse width of the current. In addition, $k_B$ denotes a Boltzmann constant, T denotes the temperature, and E denotes potential energy.

Based on Equation (2), there is an inversely proportional relation between the threshold value $J_c$ of the current density and the logarithm of the pulse width $\tau_p$. In other words, the shorter the pulse width of a current is, the higher the current density required for the transition of the magnetization direction of the free layer 14 becomes. Accordingly, to form the pulse width $\tau$ of the current applied at the time of detecting a current-induced magnetic field to be shorter corresponds to change the threshold value $J_c$ of the current density.

As denoted by a dotted line illustrated in FIG. 6(*a*), when the vertical axis is set as the current densities $J_1, J_2, \ldots, J_N$, and the horizontal axis is set as the logarithmic values $\tau_1, \tau_2, \ldots, \tau_N$ of the pulse widths, the relation forms a linear relation.

According to this embodiment, the quantization samplings are performed by associating the changes (the number N of quantization samplings) in the current density illustrated in FIG. 3 with the current widths of N currents. Therefore, according to this embodiment, N quantization samplings can be performed by employing only one spin valve structure.

The non-contact current sensor 1 according to this embodiment includes: the TMR element 2 that includes the free layer 14, the pinned layer 12, and the tunnel insulating film 13 arranged between the free layer 14 and the pinned layer 12 as a nonmagnetic layer; the electrical unit 4 that applies a current to the TMR element 2 at the time of detecting the current-induced magnetic field A; and the resistance reading unit 5 that electrically reads out the resistance value of the TMR element 2 at the time of detecting the current-induced magnetic field. In addition, the coercive force of the free layer 14 is configured to be larger than the current-induced magnetic field A as a detection target. Furthermore, by applying a current to the TMR element by using the electrical unit 4, the magnetization directions of the pinned layer 12 and the free layer 14 transits between the parallel state and the anti-parallel state. In addition, by reading out a resistance value corresponding to the transition between the parallel state and the anti-parallel state by using the resistance reading unit 5, the threshold value of the current corresponding to the above-described transition can be detected.

According to such a configuration, by associating the parallel state and the anti-parallel state of the magnetization direction of the free layer 14 having the spin valve structure with respect to the direction of the pinned layer 12 with logical values "0" and "1", the detection of a magnetic field by using the non-contact current sensor 1 can be performed as a digital operation. Based on the principle of such a digital operation, a current sensing operation that is strong for an environmental noise can be performed. In addition, the detection of a magnetic field with high precision can be performed through quantization corresponding to the element number of the TMR elements 2 and the current value or the current pulse (or a combination thereof) of the electrical unit 4. In other words, the detection of a current with high precision can be performed by using the non-contact current sensor 1.

In addition, the response speed of the above-described TMR element 2 is a high speed of ns or less. Furthermore, the measurement band has a wide range from DC to a magnetic resonance frequency (several GHz to tens of GHz in general). In addition, in a case where the TMR element 2 having the tunnel insulating film 13 formed from MgO is used, there is a superior advantage of acquiring a high output (up to 200%).

As above, although the embodiments of the present invention have been described, the present invention is not limited to the materials, the compositions thereof, the element sizes, the method of forming the spin valve structure, and the like of the above-described embodiments.

Although three embodiments relating to the quantization samplings have been illustrated, the embodiments may be used in an overlapping manner. In other words, by combining a configuration in which a plurality of spin valve structures are connected in series and a configuration in which the pulse height or the pulse width of the current is changed, more quantization samplings can be performed. In such a case, a magnetic field as a detection target can be detected with high precision.

EXPLANATIONS OF LETTERS OR NUMERALS

1 Non-contact current sensor
2 TMR element
3 Electric pulse source
4 Electrical unit
5 Resistance reading unit
10 Substrate
11 Lower electrode
12 Pinned layer
13 Tunnel insulating film
14 Free layer
15 Interlayer insulating film
16 Upper electrode
20 Current as measurement target
A Current-induced magnetic field
B Magnetization direction of pinned layer
C Magnetization direction of free layer

The invention claimed is:

1. A method for detecting a current-induced magnetic field in a non-contact current sensor, the method comprising:
    detecting, with a spin valve structure, a magnetic field induced by a current flowing through a wire adjacent to the spin valve structure, the spin valve structure comprising:
        a free layer having a direction of magnetization and a coercive force that is larger than the current-induced magnetic field;
        a pinned layer having a direction of magnetization; and
        a nonmagnetic layer arranged between the free layer and the pinned layer;

applying, with an electrical unit, a current to the spin valve structure to cause the direction of magnetization of the pinned layer and the direction of magnetization of the free layer to transition between a mutually parallel state and a mutually anti-parallel state; and electrically reading, with a resistance reading unit, a resistance value of the spin valve structure if the current-induced magnetic field is detected.

2. The method of claim 1, wherein said electrically reading a resistance value of the spin valve structure comprises detecting, by the resistance reading unit, a threshold value of the current corresponding to the transition between the mutually parallel state and the mutually anti-parallel state to determine the resistance value at the transition.

3. The method of claim 2, wherein the threshold value of the current changes based, at least in part, on a magnitude of the current-induced magnetic field.

4. The method of claim 3, wherein the threshold value of the current is changed by changing an electric bias value with the electrical unit.

5. The method of claim 1, wherein the resistance value of the spin valve structure electrically read by the resistance reading unit corresponds with one of:
  a first logical value that is associated with the mutually parallel state direction of magnetization of the pinned layer and the free layer; or
  a second logical value that is associated with the mutually anti-parallel state direction of magnetization of the pinned layer and the free layer.

6. The method of claim 1, wherein the spin valve structure is one of a plurality of spin valve structures connected in series, and wherein each of the plurality of spin valve structures has a different area.

7. The method of claim 1, wherein said applying a current to the spin valve structure comprises applying a plurality of pulses by a pulse source of the electrical unit, and wherein the pulse source changes the pulse height every time one of the plurality of pulses is applied.

8. The method of claim 1, wherein said applying a current to the spin valve structure comprises applying a plurality of pulses by a pulse source of the electrical unit, and wherein the pulse source changes the pulse width every time one of the plurality of pulses is applied.

9. The method of claim 1, wherein the nonmagnetic layer is metal.

10. The method of claim 1, wherein the nonmagnetic layer is an insulator.

11. A spin valve structure configured to detect a current-induced magnetic field, the spin valve structure comprising:
  a free layer having a direction of magnetization and a coercive force that is larger than the current-induced magnetic field;
  a pinned layer having a direction of magnetization; and
  a nonmagnetic layer arranged between the free layer and the pinned layer;
  wherein the spin valve structure is configured to receive a current to cause the direction of magnetization of the pinned layer and the direction of magnetization of the free layer to transition between a mutually parallel state and a mutually anti-parallel state.

12. The spin valve structure of claim 11, wherein the directions of magnetization of the pinned layer and the free layer transition between a mutually parallel state and a mutually anti-parallel state if a current is applied to the spin valve structure.

13. The spin valve structure of claim 11, wherein the nonmagnetic layer is metal.

14. The spin valve structure of claim 11, wherein the nonmagnetic layer is an insulator.

15. The spin valve structure of claim 11, wherein the free layer, the pinned layer, and the nonmagnetic layer are stacked using a sputtering method.

16. The spin valve structure of claim 11, wherein the pinned layer is CoFeB/Ru/CoFe/IrMn.

17. The spin valve structure of claim 11, wherein the non-magnetic layer is MgO.

18. The spin valve structure of claim 11, wherein the free layer is CoFeB.

19. The spin valve structure of claim 11, wherein an interlayer insulating film is formed on the free layer, the pinned layer, and the non-magnetic layer.

20. The spin valve structure of claim 19, wherein the interlayer insulating film is SiO2.

* * * * *